(12) United States Patent
Motamed et al.

(10) Patent No.: US 8,260,229 B2
(45) Date of Patent: Sep. 4, 2012

(54) I-Q MISMATCH COMPENSATION

(75) Inventors: Mariam Motamed, Redwood City, CA (US); Daniel F. Filipovic, Solana Beach, CA (US); Christos Komninakis, La Jolla, CA (US); Chun-Hao Hsu, San Jose, CA (US); Chengjin Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 575 days.

(21) Appl. No.: 12/468,995

(22) Filed: May 20, 2009

(65) Prior Publication Data

US 2010/0296502 A1 Nov. 25, 2010

(51) Int. Cl.
*H04B 17/02* (2006.01)
(52) U.S. Cl. .................. 455/139; 455/334; 375/324
(58) Field of Classification Search .......... 455/139, 455/334; 375/322, 324, 371; 370/342
See application file for complete search history.

(56) References Cited

U.S. PATENT DOCUMENTS

| | | | | |
|---|---|---|---|---|
| 6,304,751 B1 * | 10/2001 | King | | 455/306 |
| 6,765,623 B1 * | 7/2004 | Parker | | 375/235 |
| 7,061,994 B2 * | 6/2006 | Li et al. | | 375/316 |
| 7,783,273 B2 * | 8/2010 | Maeda et al. | | 455/285 |
| 7,830,954 B2 * | 11/2010 | Welz et al. | | 375/219 |
| 2002/0097812 A1 * | 7/2002 | Wiss | | 375/316 |
| 2003/0072393 A1 | 4/2003 | Gu | | |
| 2005/0070236 A1 | 3/2005 | Paulus | | |
| 2007/0080835 A1 | 4/2007 | Maeda et al. | | |

OTHER PUBLICATIONS

International Search Report and Written Opinion—PCT/US2010/035278, International Search Authority—European Patent Office—Aug. 25, 2010.
"I-Q Imbalance", Fred Harris, SDSU pp. 1-42.

* cited by examiner

*Primary Examiner* — Quochien B Vuong
(74) *Attorney, Agent, or Firm* — Rupit M. Patel (57) ABSTRACT

Techniques for compensating for I-Q mismatch in a communications receiver. In an exemplary embodiment, incoming I and Q samples are adjusted by multiplying with certain compensation coefficients to generate mismatch-compensated I and Q samples. The compensation coefficients may themselves be calculated and iteratively refined from the mismatch-compensated I and Q samples. Further techniques for partitioning the adjustment and estimation functions among computational hardware are disclosed. In an exemplary embodiment, estimation may be restricted to only those segments of the incoming I and Q samples that fulfill certain conditions, e.g., segments of the incoming I and Q samples known to be statistically uncorrelated and/or to have equal average energy.

25 Claims, 5 Drawing Sheets

I-Q MISMATCH COMPENSATION

TECHNICAL FIELD

The disclosure relates to the design of communications receivers, and particularly, to the compensation of I-Q mismatch in communications receivers.

BACKGROUND

In a communications transmitter, information may be modulated onto orthogonal signals known as in-phase (I) and quadrature (Q) carriers to form I and Q channels. At a receiver, the transmitted I and Q channels may be demodulated to recover the information of interest. Accurate transmission and reception of information requires that the I and Q channels remain orthogonal to each other over the communications link.

In practice, mismatch may arise between the I and Q channels at the transmitter, over the communications link, or at the receiver, e.g., mismatch between I and Q downconversion paths in the receiver, and/or other sources. Such mismatch introduces correlation between the I and Q channels, causing information from the I channel to "bleed" into the Q channel, and vice versa. This leads to corruption of the information signals.

It would be desirable to provide techniques for estimating the I-Q mismatch at a receiver, and applying techniques to adjust the signals received in the I and Q channels to compensate for such I-Q mismatch. It would be further desirable to allow for flexible implementation of such techniques by partitioning the operations of estimating the mismatch and adjusting for the mismatch.

SUMMARY

An aspect of the present disclosure provides a method for compensating mismatch between uncorrected I and Q samples to generate corrected I and Q samples, the method comprising: receiving uncorrected I and Q samples; multiplying the uncorrected I samples with a first coefficient; multiplying the uncorrected Q samples with a second coefficient; adding the results of the steps of multiplying to generate corrected Q samples; outputting the uncorrected I samples and the corrected Q samples as corrected I and Q samples, respectively; and estimating the first and second coefficients from the corrected I and Q samples.

Another aspect of the present disclosure provides an apparatus for compensating mismatch between uncorrected I and Q samples to generate corrected I and Q samples, the corrected I samples corresponding to the uncorrected I samples, the apparatus comprising: a first multiplier configured to multiply the uncorrected I samples with a first coefficient; a second multiplier configured to multiply the uncorrected Q samples with a second coefficient; an adder configured to add the results of the steps of multiplying to generate corrected Q samples; and a coefficient estimation block configured to estimate the first and second coefficients from the corrected I and Q samples.

Yet another aspect of the present disclosure provides an apparatus for compensating mismatch between uncorrected I and Q samples to generate corrected I and Q samples, the corrected I samples corresponding to the uncorrected I samples, the apparatus comprising: means for receiving uncorrected I and Q samples; means for multiplying the uncorrected I samples with a first coefficient; means for multiplying the uncorrected Q samples with a second coefficient; means for adding the results of the steps of multiplying to generate corrected Q samples; means for outputting the uncorrected I samples and the corrected Q samples as corrected I and Q samples, respectively; and means for estimating the first and second coefficients from the corrected I and Q samples.

Yet another aspect of the present disclosure provides a computer-readable storage medium storing code for causing a computer to compensate mismatch between uncorrected I and Q samples to generate corrected I and Q samples, the corrected I samples corresponding to the uncorrected I samples, the code comprising: code for causing a computer to receive uncorrected I and Q samples; code for causing a computer to multiply the uncorrected I samples with a first coefficient; code for causing a computer to multiply the uncorrected Q samples with a second coefficient; code for causing a computer to add the results of the steps of multiplying to generate corrected Q samples; code for causing a computer to output the uncorrected I samples and the corrected Q samples as corrected I and Q samples, respectively; and code for causing a computer to estimate the first and second coefficients from the corrected I and Q samples.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Figure 1:
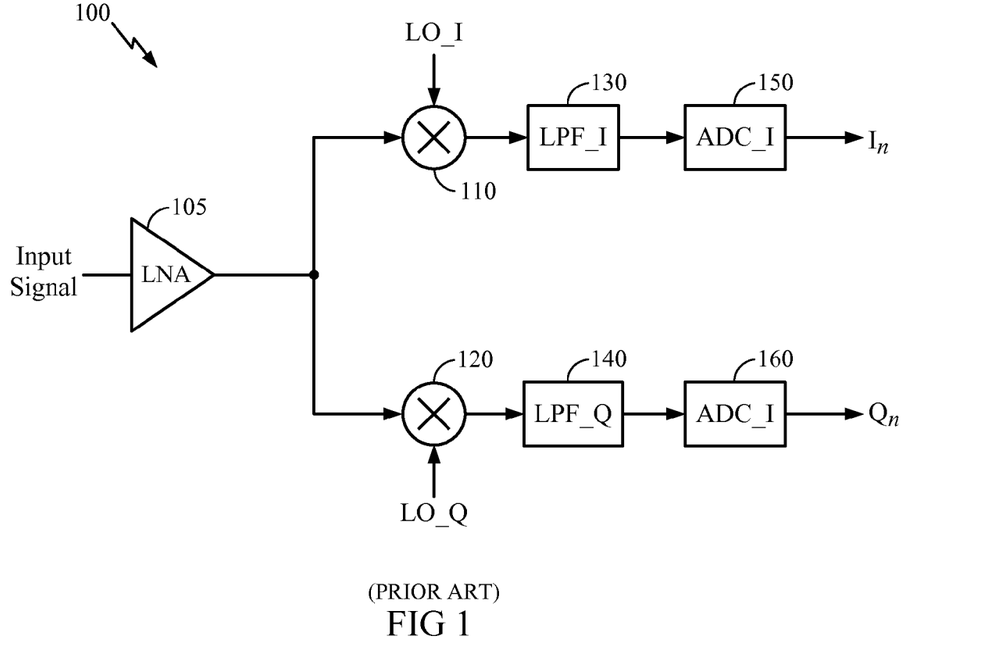
FIG. 1 illustrates a simplified block diagram of a prior art receiver for a communications system.

FIG. 1 illustrates a simplified block diagram of a prior art receiver 100 for a communications system. In FIG. 1, an input signal containing information modulated onto in-phase (I) and quadrature (Q) channels is provided to a low-noise amplifier (LNA) 105. The LNA output is coupled to an I mixer 110 and a Q mixer 120. I mixer 110 mixes the LNA output signal with an in-phase local oscillator signal LO_I, while Q mixer 120 mixes the LNA output signal with a quadrature local oscillator signal LO_Q. The outputs of mixers 110, 120 are provided to low-pass filters 130, 140, respectively, and subsequently digitized by analog-to-digital converters 150, 160 to produce digital output samples $I_n$ and $Q_n$.

Note the receiver depicted in FIG. 1 is a direct conversion receiver, i.e., the received RF signal is converted directly to baseband by the mixers 110, 120. One of ordinary skill in the art will realize that the techniques disclosed herein may readily be applied to receivers having a non-zero intermediate frequency (IF). Such exemplary embodiments are contemplated to be within the scope of the present disclosure.

In FIG. 1, the I local oscillator signal LO_I and the Q local oscillator signal LO_Q are designed to be 90 degrees out of phase with each other, while the I mixer 110 and Q mixer 120 are designed to have identical gain and phase responses. In practice, the phase difference between LO_I and LO_Q may deviate from 90 degrees, and the gain and/or phase responses of the I mixer 110 and Q mixer 120 may be mismatched. These factors, as well as other imbalances resulting in gain and/or phase mismatch between the I and Q channels, may be collectively referred to as "I-Q mismatch." The effects of such I-Q mismatch may be modeled as shown in FIG. 1A.

Figure 1A:
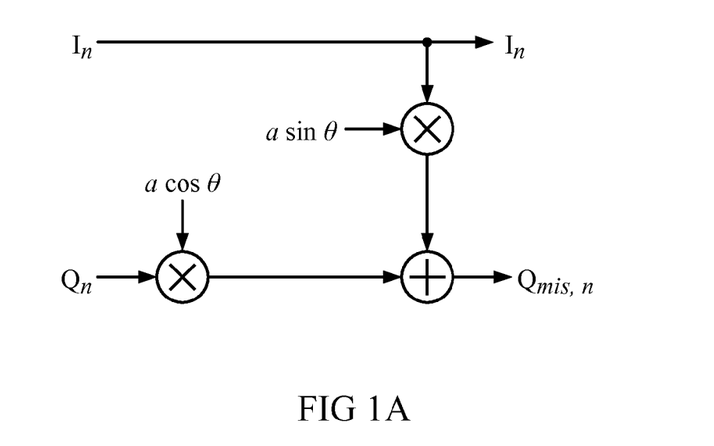
FIG. 1A illustrates a model of the effects of I-Q mismatch.

In FIG. 1A, idealized in-phase ($I_n$) and quadrature ($Q_n$) downconverted samples are shown. $I_n$ and $Q_n$ have equal average amplitudes, and have exactly 90-degree phase difference relative to each other. The sample $Q_n$ is shown multiplied by a factor a cos θ, and further added with a term corresponding to $I_n$ a sin θ to generate a mismatched quadrature term $Q_{mis,n}$. One of ordinary skill in the art will appreciate that there is no loss of generality in assuming that mismatch is only present in the Q channel, as it is the relative mismatch between the I and Q channels that is important.

As previously mentioned, I-Q mismatch in the receiver 100 may lead to corruption of information modulated onto the I and Q carriers. Thus it is desirable to have compensation techniques for adjusting the $I_n$ and/or $Q_{mis,n}$ output samples to compensate for such mismatch.

Figure 2:
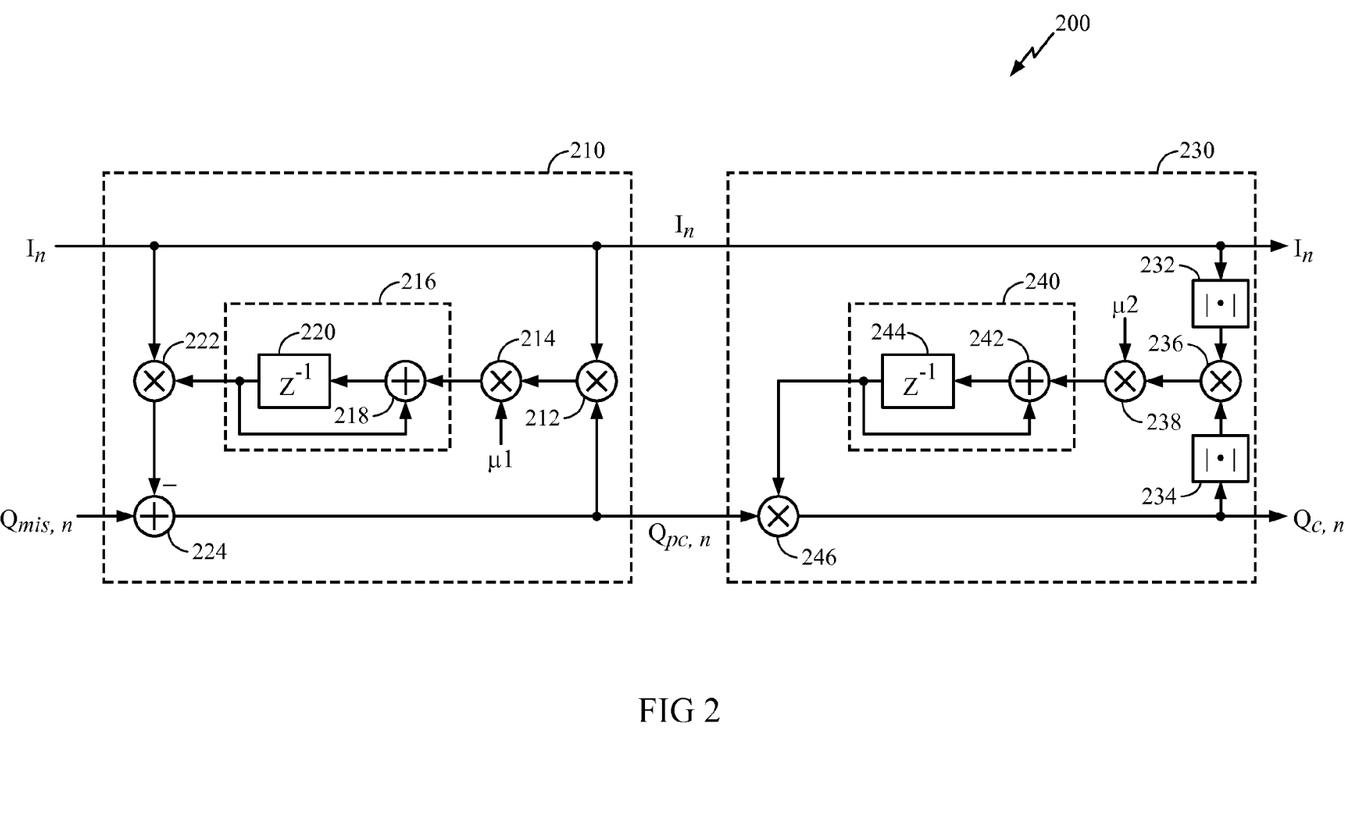
FIG. 2 illustrates an I-Q mismatch compensation scheme.

FIG. 2 illustrates an I-Q mismatch compensation scheme 200. The compensation scheme 200 may be applied to the terms $I_n$ and $Q_{mis,n}$ shown in FIG. 1A to generate a corrected I output $I_n$ and a corrected Q output $Q_{c,n}$.

In FIG. 2, a phase compensation block 210 is first applied to samples $I_n$ and $Q_{mis,n}$ to generate samples $I_n$ and $Q_{pc,n}$. Phase compensation block 210 is based on a feedback adjustment scheme further described as follows.

In block 210, a multiplier 212 is provided for multiplying $I_n$ with $Q_{pc,n}$. The output of multiplier 212 is further multiplied by an adaptation constant μ1 using multiplier 214. The constant μ1 may be understood as controlling the rate of adaptation of the feedback loop represented by the phase compensation block 210, with larger values of μ1 generally corresponding to faster adaptation speed. The output of multiplier 214 is low-pass filtered by LPF 216. In the implementation shown, LPF 216 includes a delay element 220 and an adder 218, with the output of the delay element 220 taken as the output of the LPF 216, and also fed back to the adder 218. The output of LPF 216 is multiplied with $I_n$, and the result is subtracted from $Q_{mis,n}$ using cancellation adder 224 to generate the phase-corrected Q component $Q_{pc,n}$.

In FIG. 2, an amplitude compensation block 230 is further applied to samples $I_n$ and $Q_{pc,n}$ to generate samples $I_n$ and $Q_{c,n}$. Amplitude compensation block 230 is also based on a feedback adjustment scheme further described as follows.

In block 230, absolute value operation blocks 232 and 234 are provided to generate the absolute value associated with the samples $I_n$ and $Q_{c,n}$, respectively. The difference between the outputs of blocks 232 and 234 is computed by cancellation adder 236, and multiplied by an adaptation constant μ2 using multiplier 238. The output of multiplier 238 is filtered by LPF 240, which again includes an adder 242 and a delay element 244. The output of LPF 240 is directly multiplied to $Q_{pc,n}$ by multiplier 246 to generate the phase- and amplitude-corrected Q component $Q_{c,n}$.

Figure 3:
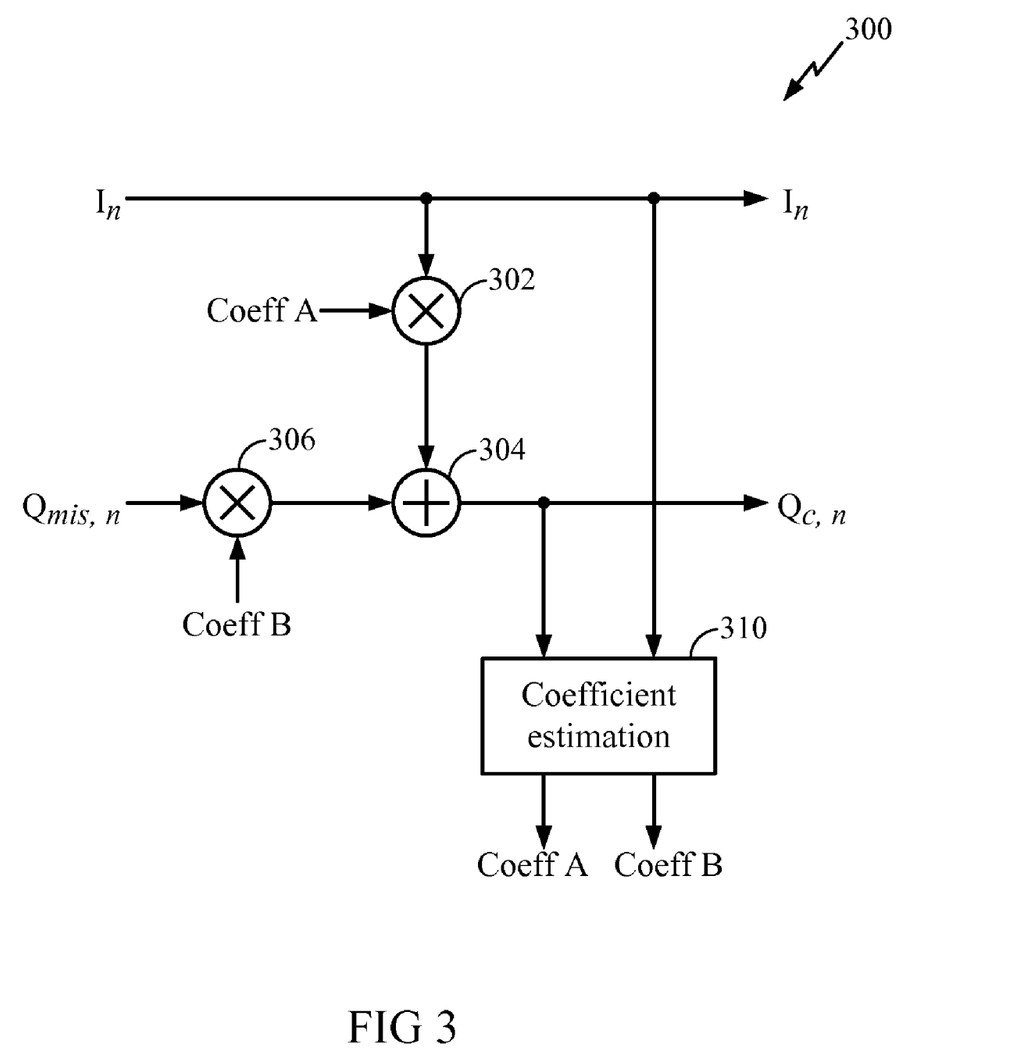
FIG. 3 illustrates an exemplary embodiment of an I-Q mismatch compensation block according to the present disclosure.

FIG. 3 illustrates an exemplary embodiment 300 of an I-Q mismatch compensation block according to the present disclosure. In FIG. 3, $I_n$ is multiplied with a compensation coefficient CoeffA using multiplier 302, while $Q_{mis,n}$ is multiplied with a compensation coefficient CoeffB using multiplier 306. The results of the multiplications by 302 and 306 are added together using adder 304 to generate the corrected Q component $Q_{c,n}$. In this specification and in the claims, the samples $I_n$ and $Q_{mis,n}$ may also be referred to as the uncorrected I and Q samples, respectively, while the samples $I_n$ and $Q_{c,n}$ may also be referred to as the corrected I and Q samples, respectively.

The operations performed by multipliers 302, 306 and adder 304 may be referred to as compensation. In an exemplary embodiment, compensation may be performed continuously on the uncorrected I and Q samples to generated corrected I and Q samples.

In an exemplary embodiment, the coefficient estimation block 310 may estimate the coefficients CoeffA and CoeffB used for compensation. In an exemplary embodiment, the coefficient estimation block 310 may derive the estimates for coefficients CoeffA and CoeffB from corrected samples $I_n$ and $Q_{c,n}$. The derivation of estimates for coefficients CoeffA and CoeffB may be performed continuously by coefficient estimation block 310, or it may be restricted to certain time intervals that are known to be advantageous to deriving accurate estimates for coefficients CoeffA and CoeffB, as further described hereinbelow.

Note in the exemplary embodiment shown, the operation of estimating the compensation coefficients CoeffA and CoeffB performed by block 310 may be advantageously separated from the operation of compensating performed by elements 302, 304, 306. This allows greater flexibility in the implementation of the I-Q mismatch compensation scheme, as will be further described hereinbelow.

Figure 4:
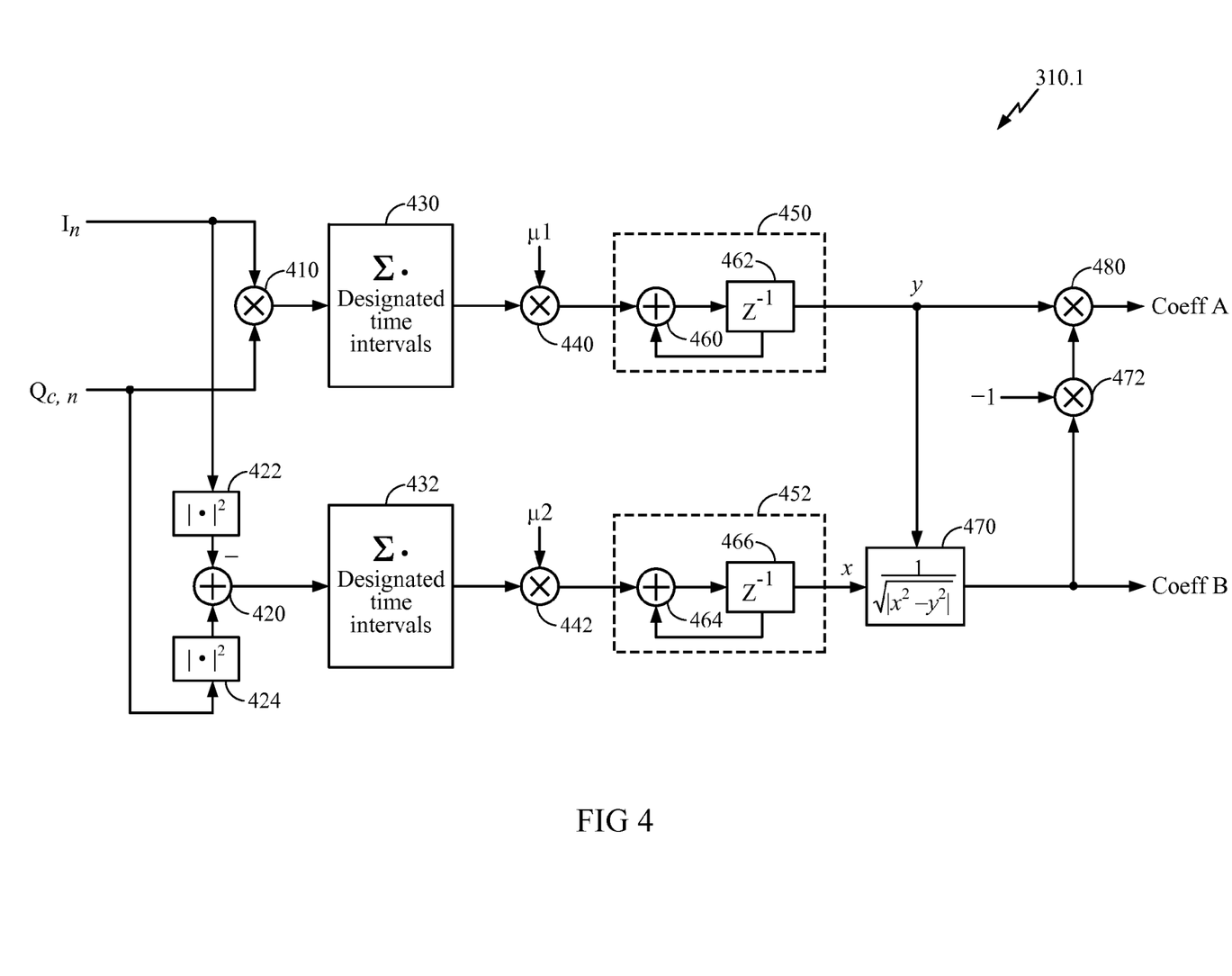
FIG. 4 illustrates an exemplary embodiment of a coefficient estimation block as shown in FIG. 3.

FIG. 4 illustrates an exemplary embodiment 310.1 of a coefficient estimation block 310 as shown in FIG. 3. Note FIG. 4 is provided for illustrative purposes only, and is not meant to limit the scope of the present disclosure to any particular techniques for estimating CoeffA and CoeffB. One of ordinary skill in the art will appreciate that Coeff A and Coeff B may be estimated in various ways in light of the principles earlier described herein, and such alternative exemplary embodiments are contemplated to be within the scope of the present disclosure.

In FIG. 4, block 310.1 accepts as inputs $I_n$ and $Q_{c,n}$ as shown in FIG. 3. $I_n$ and $Q_{c,n}$ are first multiplied with each other using a multiplier 410. The output of multiplier 410 is accumulated by an accumulation block 430. The output of accumulation block 430 is provided to a mulitplier 440 for multiplying with an adaptation constant μ1, as earlier described hereinabove. The output of mulitplier 440 is filtered by filter 450, which includes adder 460 and delay element 462, to generate the signal denoted y.

$I_n$ and $Q_{c,n}$ are further each provided to magnitude squared operation blocks 422 and 424, respectively, and combined using cancellation adder 420, which computes the difference between the magnitude squared values of $I_n$ and $Q_{c,n}$. The output of cancellation adder 420 is provided to accumulation block 432. The output of block 432 is provided to a multiplier 442 for multiplying by an adaptation constant µ2 as earlier described hereinabove. The output of multiplier 442 is filtered by filter 452, which includes adder 464 and delay element 466, to generate the signal denoted x.

Signals x and y are provided to a block 470, which computes a weighting factor $$\frac{1}{\sqrt{|x^2 - y^2|}}$$

from x and y. The output of block 470 is directly provided as Coeff B, while the product $$\frac{-y}{\sqrt{|x^2 - y^2|}}$$

as further generated by multipliers 472 and 480 is provided as Coeff A.

In an alternative exemplary embodiment, the weighting factor computed by block 470 may be refined as $$\frac{1}{\sqrt{\min(|x^2 - y^2|, \min Val)}},$$

wherein min Val is a predetermined minimum constant, and min(a, b) is a function that returns the lesser of a and b. Furthermore, in an exemplary embodiment, the values x and y may be initialized to certain values, e.g., x to an initial value of 1, and y to an initial value of 0, prior to first corrected samples $I_n$ and $Q_{c,n}$ being available for coefficient estimation block 310.

Note the exemplary embodiment 300 advantageously allows the compensation to $I_n$ and $Q_{mis,n}$ to be estimated from a single set of samples $I_n$, $Q_{c,n}$, rather than from two sets of samples $I_n$, $Q_{pc,n}$, and $I_n$, $Q_{c,n}$, such as called for by the scheme 200 in FIG. 2. This facilitates an exemplary embodiment of the present disclosure wherein, e.g., sample-by-sample multiplication by multipliers 302, 306 and addition by adder 304 as shown in FIG. 3 may be performed using a dedicated module, e.g., dedicated hardware. In an exemplary embodiment, estimation of coefficients Coeff A and Coeff B shown in FIG. 4 may be performed using a dedicated module, e.g., in firmware. Such exemplary embodiments are contemplated to be within the scope of the present disclosure.

In an exemplary embodiment, block 310 in FIG. 3 may be configured to perform "selective estimation" of the coefficients Coeff A and Coeff B. i.e., the estimation of Coeff A and Coeff B from $I_n$ and $Q_{c,n}$ may be performed only during pre-selected time intervals, rather than continuously. Such selective estimation may ease the computational bandwidth required from a processor to implement the operations of coefficient estimation in an exemplary embodiment of the present disclosure. For example, in a WCDMA wireless communications system, the accumulation performed by blocks 430 and 432 in block 310.1 in FIG. 4 may be performed over disjoint segments, e.g., over a designated number of chips in each WCDMA frame, thus providing flexibility in the selection of update rate and corresponding computational requirements. To show this, blocks 430 and 430 are accordingly labeled "Designated time intervals," meaning the indicated accumulation may be configured to be performed only over designated time intervals.

Furthermore, selective estimation may further limit the estimation of Coeff A and Coeff B to only those portions of the incoming data $I_n$ and $Q_{c,n}$ which are known a priori to be statistically uncorrelated. For example, estimation of Coeff A and Coeff B may be restricted to only those slots of a WCDMA frame that do not contain a synchronization channel, or SCH, code, as such a code contains data that is identical for the I and Q channels. In a WCDMA system, SCH codes may be transmitted every tenth slot, and thus the blocks 430 and 432 may be configured to not accumulate during such slots.

Note the technique of selective estimation as disclosed hereinabove may also be implemented using techniques other than controlling the accumulation intervals of blocks 430 and 432. For example, in alternative exemplary embodiments, other blocks shown in FIG. 4 may have their operation "frozen" during a time interval when it is not desirable to perform estimation. Such alternative exemplary embodiments are contemplated to be within the scope of the present disclosure.

One of ordinary skill in the art will appreciate that while certain examples of selective estimation have been described with reference to a WCDMA system, the same principles may be applied to the design of I-Q mismatch compensation for systems operating to any communications standard. In such alternative exemplary embodiments, blocks 430 and 432 may be similarly configured to not accumulate over time periods during which the $I_n$ and $Q_{c,n}$ are known to be statistically correlated. Furthermore, blocks 430 and 432 may be configured to operate only when the incoming I data ($I_n$) is expected to have equal average amplitude with the incoming Q data ($Q_n$). On the other hand, the compensation operations performed by elements 302, 304, and 306 may be performed, e.g., continuously. Such alternative exemplary embodiments are contemplated to be within the scope of the present disclosure.

One of ordinary skill in the art will appreciate that various operations described in the exemplary embodiments above may be readily modified within the scope of the present disclosure. For example, in an alternative exemplary embodiment, magnitude squared operation blocks 422 and 424 may be replaced by blocks for computing the absolute value of the input, with appropriate scaling adjustments made to the rest of the system, such as scaling factors, to ensure loop convergence.

In alternative exemplary embodiments, the filters 450 and 452 may be implemented using alternative filter design techniques known to one of ordinary skill in the art. Furthermore, one of ordinary skill in the art will appreciate that the order of various operations shown in FIG. 4 may be modified without departing from the scope of the present disclosure.

In certain exemplary embodiments, blocks 430 and 432 may be implemented using any techniques for calculating a sample average, e.g., moving window. In further alternative exemplary embodiments, the functionality of blocks 430 and 450 may be combined into a single filter, and likewise for blocks 432 and 452. Such alternative exemplary embodiments are contemplated to be within the scope of the present disclosure.

Figure 5:
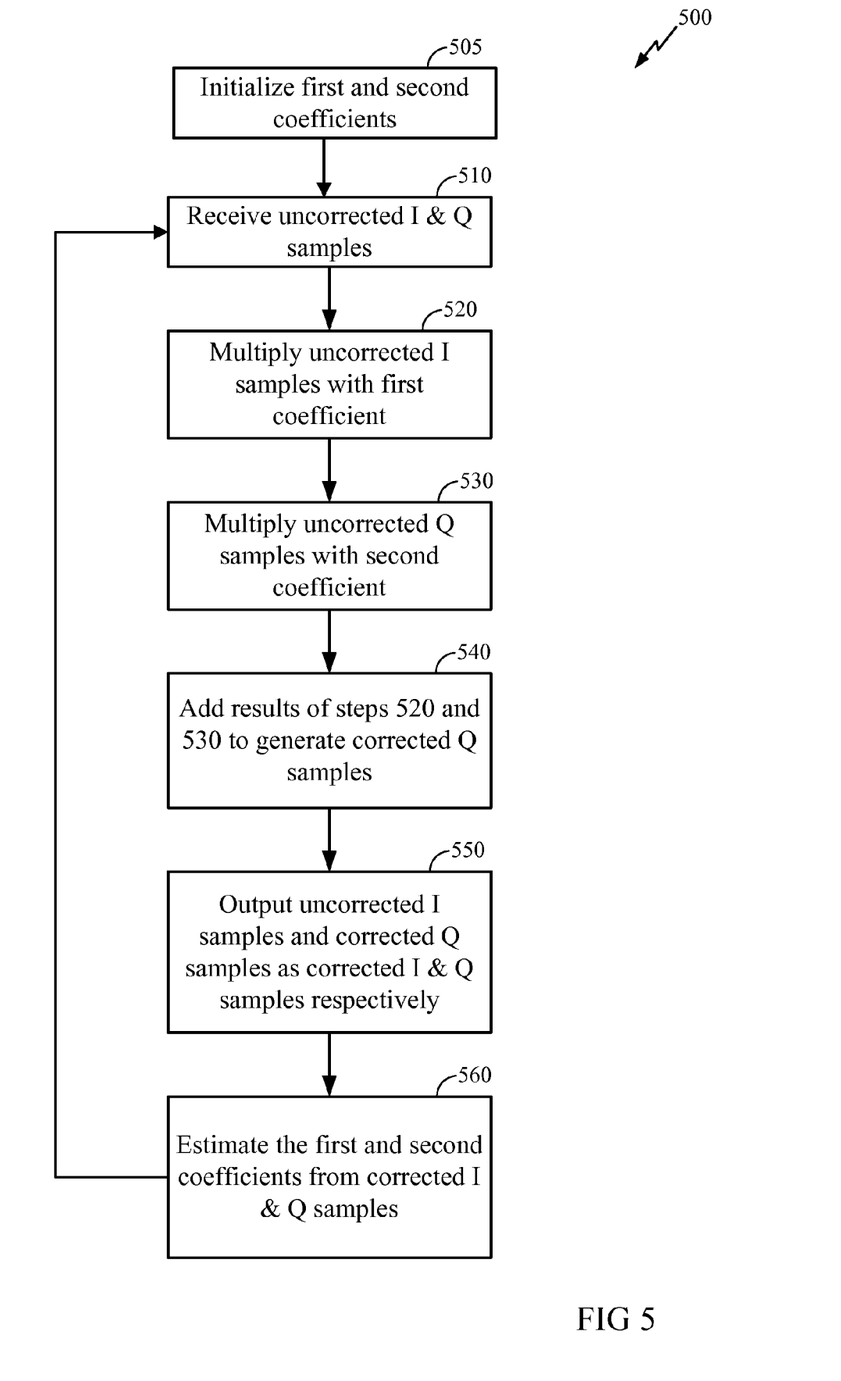
FIG. 5 illustrates an exemplary embodiment of a method according to the present disclosure.

FIG. 5 illustrates an exemplary embodiment 500 of a method according to the present disclosure. Note the method is shown for illustrative purposes only, and is not meant to restrict the scope of the present disclosure to any particular method shown.

In FIG. 5, at step 505, the first and second coefficients are initialized to initial values. In an exemplary embodiment, the first coefficient may correspond to Coeff A computed as shown in FIG. 4. In an exemplary embodiment, the second coefficient may correspond to Coeff B computed as shown in FIG. 5. In an exemplary embodiment, the first coefficient may be initialized to zero, while the second coefficient may be initialized to one.

At step 510, uncorrected I and Q samples are received.

At step 520, the uncorrected I samples are multiplied with the first coefficient.

At step 530, the uncorrected Q samples are multiplied with the second coefficient.

At step 540, the results of the steps 520 and 530 are added to generate corrected Q samples.

At step 550, the uncorrected I samples and the corrected Q samples are output as corrected I and Q samples, respectively.

At step 560, the first and second coefficients are estimated from the corrected I and Q samples. In an exemplary embodiment, the first and second coefficients may be continuously updated as further corrected I and Q samples are generated.

After step 560, the method may return to step 510 to receive further uncorrected I and Q samples.

While exemplary embodiments have been described wherein compensation is performed solely on uncorrected Q samples to generated corrected Q samples, one of ordinary skill in the art will appreciate that alternative exemplary embodiments may instead perform compensation on uncorrected I samples, or both uncorrected I and Q samples, without departing from the scope of the present disclosure. One of ordinary skill in the art will appreciate that references made herein to "Q" samples may be readily interchanged with references to "I" samples, and vice versa.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for compensating mismatch between uncorrected I and Q samples to generate corrected I and Q samples, the method comprising:
   receiving uncorrected I and Q samples;
   multiplying the uncorrected I samples with a first coefficient;
   multiplying the uncorrected Q samples with a second coefficient;
   adding the results of the steps of multiplying to generate corrected Q samples;
   outputting the uncorrected I samples and the corrected Q samples; and
   estimating the first and second coefficients from the uncorrected I samples and corrected Q samples.

2. The method of claim 1, the estimating the first and second coefficients further comprising updating the estimates of the first and second coefficients as further corrected I and Q samples are available.

3. The method of claim 2, the method further comprising initializing the first and second coefficients to one and zero, respectively.

4. The method of claim 1, the estimating the first and second coefficients comprising:
   multiplying the uncorrected I and Q samples with each other;
   accumulating the multiplied output;
   scaling the multiplied output;
   filtering the multiplied output;
   generating a y signal based on said steps of multiplying, accumulating, scaling, and filtering.

5. The method of claim 4, the estimating the first and second coefficients further comprising:
   computing the difference between the magnitude squared values of the uncorrected I and Q samples;
   accumulating the difference;
   scaling the difference;
   filtering the difference; and
   generating an x signal based on said steps of computing, accumulating, scaling, and filtering.

6. The method of claim 5, the estimating the first and second coefficients further comprising:
   computing
   $$\frac{1}{\sqrt{|x^2 - y^2|}}$$
   from the x and y signals;
   estimating the second coefficient as
   $$\frac{1}{\sqrt{|x^2 - y^2|}};$$
   and
   estimating the first coefficient as
   $$\frac{-y}{\sqrt{|x^2 - y^2|}}.$$

7. The method of claim 6, further comprising limiting the minimum value of $|x^2-y^2|$ to a minimum constant minVal prior to estimating the first and second coefficients.

8. The method of claim 6, the estimating the first and second coefficients from the I corrected I and Q samples being restricted to predetermined time intervals.

9. The method of claim 8, the predetermined time intervals comprising intervals over which I and Q samples are known a priori to be uncorrelated, and to have equal energy.

10. The method of claim 9, the predetermined time intervals comprising a segment of each WCDMA frame.

11. The method of claim 9, the predetermined time intervals comprising intervals not corresponding to a synchronization channel (SCH) code transmission in a WCDMA frame.

12. The method of claim 1, further comprising performing the steps of multiplying with the first and second coefficients and adding the results using dedicated hardware.

13. The method of claim 12, further comprising performing the step of estimating the first and second coefficients using a processor.

14. An apparatus for compensating mismatch between uncorrected I and Q samples to generate corrected I and Q samples, the corrected I samples corresponding to the uncorrected I samples, the apparatus comprising:
   a first multiplier configured to multiply the uncorrected I samples with a first coefficient;
   a second multiplier configured to multiply the uncorrected Q samples with a second coefficient;
   an adder configured to add the results of the steps of multiplying to generate corrected Q samples; and
   a coefficient estimation block configured to estimate the first and second coefficients from the uncorrected I samples and corrected Q samples.

15. The apparatus of claim 14, the coefficient estimation block configured to updated the estimates of the first and second coefficients as further corrected I and Q samples are available.

16. The apparatus of claim 15, the first and second coefficients being initialized to one and zero, respectively.

17. The apparatus of claim 14, the coefficient estimation block configured to:
   multiply the uncorrected I and Q samples with each other;
   accumulate the multiplied output;
   scale the multiplied output;
   filter the multiplied output; and
   generate a y signal based on the accumulated, scaled, and filtered multiplied output; the coefficient estimation block further configured to:
   compute the difference between the magnitude squared values of the uncorrected I and Q samples;
   accumulate the difference;
   scale the difference;
   filter the difference; and
   generate an x signal based on the accumulated, scaled, and filtered difference; the coefficient estimation block further configured to:
   compute
   $$\frac{1}{\sqrt{|x^2 - y^2|}}$$
   from the x and y signals;
   estimate the second coefficient as
   $$\frac{1}{\sqrt{|x^2 - y^2|}};$$
   and
   estimate the first coefficient as
   $$\frac{-y}{\sqrt{|x^2 - y^2|}}.$$

18. The apparatus of claim 17, the coefficient estimation block further configured to limit the minimum value of $|x^2-y^2|$ to a minimum constant minVal prior to estimating the first and second coefficients.

19. The apparatus of claim 17, the coefficient estimation block further configured to estimate the first and second coefficients from the corrected I and Q samples only during predetermined time intervals.

20. The apparatus of claim 14, the first multiplier, second multiplier, and adder implemented using dedicated hardware.

21. The apparatus of claim 20, the coefficient estimation block implemented using a processor.

22. An apparatus for compensating mismatch between uncorrected I and Q samples to generate corrected I and Q samples, the corrected I samples corresponding to the uncorrected I samples, the apparatus comprising:
- means for receiving uncorrected I and Q samples;
- means for multiplying the uncorrected I samples with a first coefficient;
- means for multiplying the uncorrected Q samples with a second coefficient;
- means for adding the results of the steps of multiplying to generate corrected Q samples;
- means for outputting the uncorrected I samples and the corrected Q samples; and
- means for estimating the first and second coefficients from the uncorrected I samples and corrected Q samples.

23. The apparatus of claim 22, the means for estimating further comprising means for restricting estimation to predetermined time intervals.

24. A computer-readable storage medium storing code for causing a computer to compensate mismatch between uncorrected I and Q samples to generate corrected I and Q samples, the corrected I samples corresponding to the uncorrected I samples, the code comprising:
- code for causing a computer to receive uncorrected I and Q samples;
- code for causing a computer to multiply the uncorrected I samples with a first coefficient;
- code for causing a computer to multiply the uncorrected Q samples with a second coefficient;
- code for causing a computer to add the results of the steps of multiplying to generate corrected Q samples;
- code for causing a computer to output the uncorrected I samples and the corrected Q samples; and
- code for causing a computer to estimate the first and second coefficients from the uncorrected I samples and corrected Q samples.

25. The computer-readable storage medium of claim 24, the code for causing a computer to estimate the first and second coefficients from the corrected I and Q samples further comprising code for restricting estimation to predetermined time intervals.

\* \* \* \* \*